(12) United States Patent
Kim et al.

(10) Patent No.: US 11,453,431 B2
(45) Date of Patent: Sep. 27, 2022

(54) MOTOR CONTROLLER

(71) Applicant: MANDO CORPORATION, Gyeonggi-do (KR)

(72) Inventors: Ji Hwan Kim, Gyeonggi-do (KR); Su-Min Lee, Gyeonggi-do (KR)

(73) Assignee: MANDO CORPORATION, Gyeonggi-do (KR)

( * ) Notice: Subject to any disclaimer, the term of this patent is extended or adjusted under 35 U.S.C. 154(b) by 212 days.

(21) Appl. No.: 16/898,436

(22) Filed: Jun. 11, 2020

(65) Prior Publication Data

US 2020/0391785 A1 Dec. 17, 2020

(30) Foreign Application Priority Data

Jun. 17, 2019 (KR) .......................... 10-2019-0071479

(51) Int. Cl.
| | |
|---|---|
| *H05K 7/20* | (2006.01) |
| *B62D 5/04* | (2006.01) |
| *H02K 5/22* | (2006.01) |
| *H02K 11/33* | (2016.01) |

(52) U.S. Cl.
CPC .......... *B62D 5/0406* (2013.01); *H02K 5/225* (2013.01); *H02K 11/33* (2016.01); *H05K 7/20* (2013.01)

(58) Field of Classification Search
CPC ................................. H05K 1/14; H05K 1/144
See application file for complete search history.

(56) References Cited

U.S. PATENT DOCUMENTS

| | | | |
|---|---|---|---|
| 2007/0134951 A1* | 6/2007 | Inagaki | H05K 3/284 439/74 |
| 2017/0294860 A1* | 10/2017 | Yamasaki | H02K 11/215 |
| 2018/0244301 A1* | 8/2018 | Fujimoto | H02K 11/33 |

FOREIGN PATENT DOCUMENTS

KR 10-0737135 7/2007

* cited by examiner

*Primary Examiner* — Mukundbhai G Patel
(74) *Attorney, Agent, or Firm* — Ladas & Parry, LLP (57) ABSTRACT

A motor controller is disclosed. A motor controller according to one embodiment of the present invention comprises a first electronic control unit (ECU) which comprises a first substrate having a first length and controls a motor, a connector which is connected to one end portion of one longitudinal side of the first substrate to transmit power and a signal to the first ECU, a second ECU which comprises a second substrate having a second length shorter than the first length and including one surface facing one surface of the first substrate and controls the motor, and a connection element which is disposed to connect the first ECU and the second ECU in a circuit and transmits the power and the signal to the second ECU.

17 Claims, 8 Drawing Sheets

MOTOR CONTROLLER

CROSS-REFERENCE TO RELATED APPLICATION

This application claims priority to and the benefit of Korean Patent Application No. 10-2019-0071479, filed on Jun. 17, 2019, the disclosure of which is incorporated herein by reference in its entirety.

BACKGROUND

1. Field of the Invention

The present invention relates to a motor controller, and more specifically, to a motor controller disposed at one side of a motor to control driving of the motor.

2. Discussion of Related Art

Electronic control units (ECUs), which control rotating speeds or torques of motors and are separate from main ECUs, are provided in electric power steering (EPS) systems or the like of vehicles. Recently, packaging technology of integrally forming a motor and an ECU has been used.

Meanwhile, in a trend in which the number of electronic systems of a vehicle is increased and fail/safety related regulations (ISO26262) are tightened, redundancy designs are applied corresponding to the fail/safety related regulations. In order to apply redundancy design to control a motor, an additional ECU is required. This means that two ECUs should be disposed in a package.

In this situation, securing space efficiency and reducing size become important technical challenges when a motor and ECUs are packaged.

Meanwhile, in a case in which two ECUs configured to control the motor are present, power and control signals should be transmitted to the two ECUs. However, the conventional wiring harness of a vehicle is generally formed to be connected to only one ECU.

Accordingly, the development of a technology capable of simultaneously transmitting power and control signals to two ECUs is required without excessively modifying the conventional wiring harness of the vehicle.

RELATED ART

Patent Document

KR 10-0737135

SUMMARY OF THE INVENTION

The present invention is directed to providing a motor controller capable of transmitting power and control signals to two electronic control units (ECUs) through even one connector.

In addition, the present invention is also directed to providing a motor controller allowing a size of a package to be minimized due to improved space efficiency.

According to an aspect of the present invention, there is provided a motor controller including a first ECU which comprises a first substrate having a first length and controls a motor, a connector which is connected to one end portion of one longitudinal side of the first substrate to transmit power and a signal to the first ECU, a second ECU which comprises a second substrate having a second length shorter than the first length and including one surface facing one surface of the first substrate and controls the motor, and a connection element which is disposed to connect the first ECU and the second ECU in a circuit and transmits the power and the signal to the second ECU.

In this case, the second length may have a length such that the one surface of the second substrate is disposed to overlap the one surface of the first substrate in a longitudinal direction without interference with the connector.

In addition, the connection element may include a busbar of which one end portion is connected to the first substrate and the other portion is connected to the second substrate.

The first ECU may be disposed at a side, which is opposite to an output shaft, of the motor along an axis extending in a longitudinal direction of the motor.

The motor controller may further comprise a heat radiation member disposed along the axis extending in the longitudinal direction of the motor and configured to radiate heat generated by the first ECU and the second ECU.

The heat radiation member may comprise a first heat radiation portion disposed between the first substrate and the second substrate and having a plate shape.

The first ECU and the second ECU may comprise a first power circuit and a second power circuit disposed on the first substrate and the second substrate, and the first heat radiation portion may comprise a first protrusion and a second protrusion formed to protrude from one side surface and the other side surface of the first heat radiation portion in contact with the first substrate and the second substrate so as to be in contact with the first power circuit and the second power circuit.

At least a part of the first protrusion may not overlap the second protrusion when viewed from above.

The first heat radiation portion may comprise a recessed portion formed to be recessed from an end portion of one side of the first heat radiation portion toward the other side to prevent interference with the connection element.

The heat radiation member may further comprise a second heat radiation portion disposed to be in contact with an end portion of the side, which is opposite to the output shaft, of the motor and connected to the first heat radiation portion.

The second heat radiation portion may be formed to have an annular shape.

The motor controller may further comprise a motor position sensing unit disposed to be in contact with an end portion of the side, which is opposite to the output shaft, of the motor and configured to provide motor position sensing information to the first ECU and the second ECU.

The motor position sensing unit may comprise a connection substrate disposed to be in contact with the end portion of the side, which is opposite to the output shaft, of the motor, a first terminal provided on the connection substrate to be connected to the first ECU, a second terminal provided on the connection substrate to be connected to the second ECU, and a motor position sensor coupled to the connection substrate.

Each of the first terminal and the second terminal may have an identification (ID) which is identified in hardware.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, embodiments of the present invention will be described in detail with reference to the accompanying drawings in order for those skilled in the art to easily perform the present invention. The present invention may be implemented in several different forms and is not limited to the embodiments described herein. Parts irrelevant to the description will be omitted in order to clearly describe the present invention, and the same or similar parts are denoted by the same reference numerals throughout this specification.

It should be understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

Figure 1:
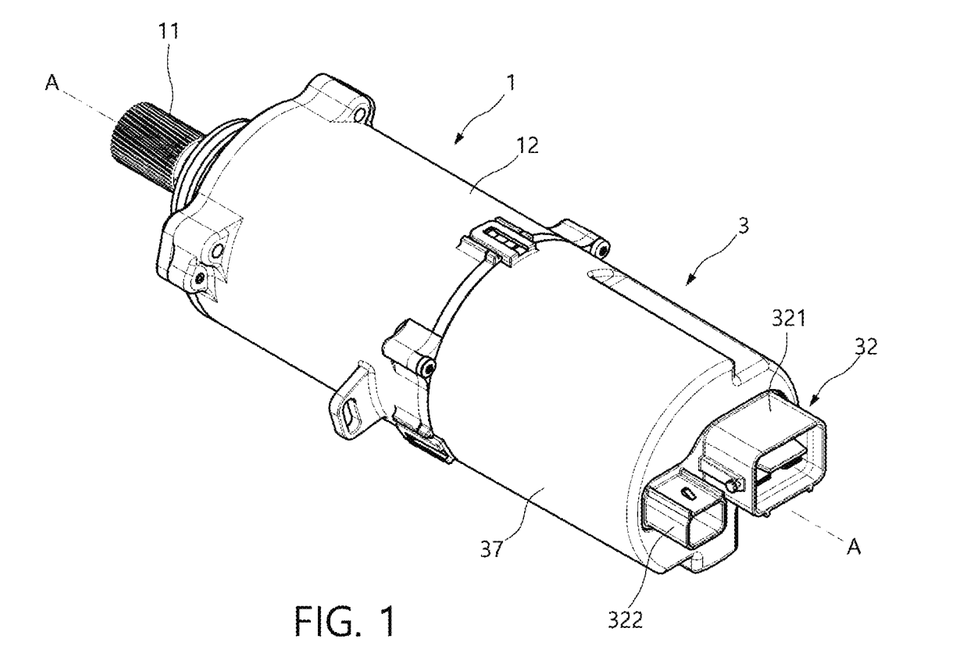
FIG. 1 is a perspective view illustrating a motor package including a motor controller according to one embodiment of the present invention.

FIG. 1 is a perspective view illustrating a motor package including a motor controller according to one embodiment of the present invention.

A motor controller 3 according to one embodiment of the present invention is a controller configured to control a motor 1. More specifically, the motor controller according to one embodiment of the present invention may control any one or more of a rotating speed and a torque. In this case, the motor 1 may be applied to an electric power steering (EPS) system. That is, the motor 1 may generate an auxiliary steering force corresponding to a steering angle and a torque detected when a driver manipulates a steering wheel.

Referring to FIG. 1, the motor controller 3 according to one embodiment of the present invention may be disposed at a side, which is opposite to an output shaft 11, of the motor 1 along an axis A extending in a longitudinal direction of the motor 1. In other words, the motor controller 3 according to one embodiment of the present invention may be disposed to be connected to the motor 1 at a side, which is opposite to the output shaft 11, of both sides of a motor housing 12.

Figure 2:
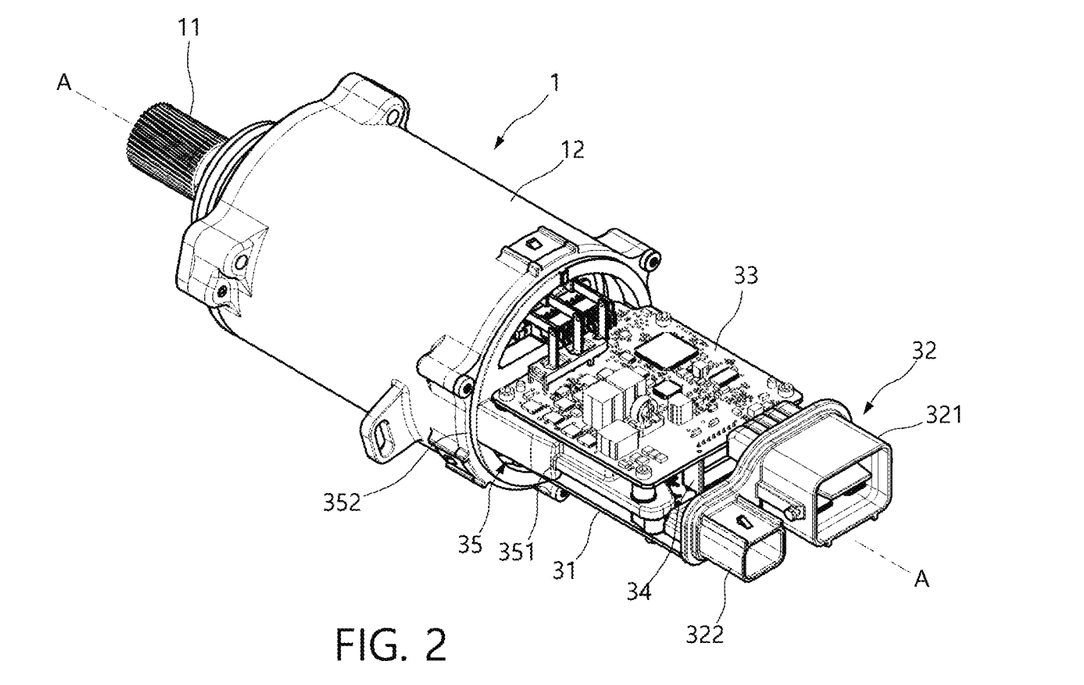
FIG. 2 is a perspective view illustrating the motor package including the motor controller according to one embodiment of the present invention in a state in which a cover of the motor controller is removed.
Figure 3:
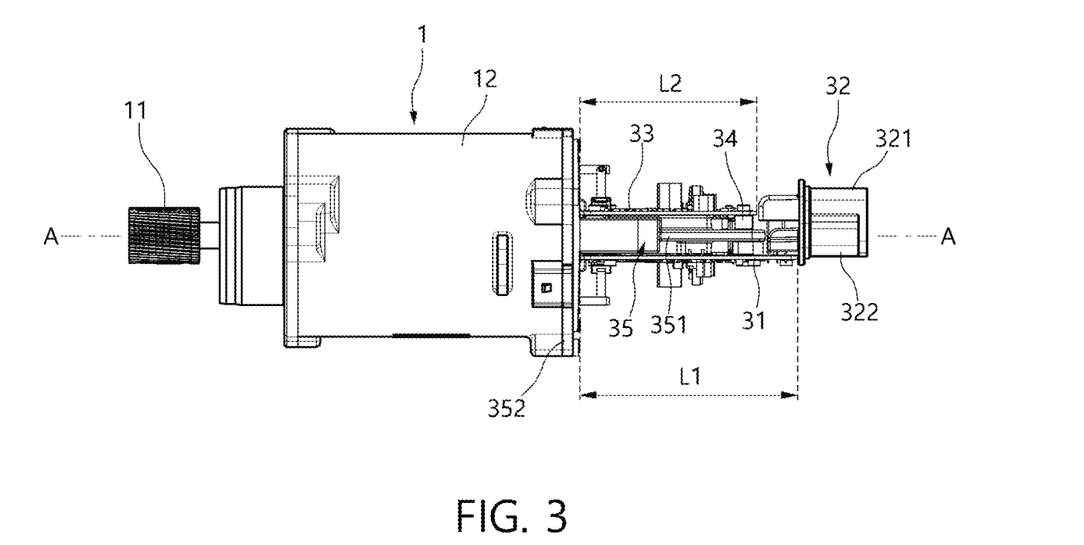
FIG. 3 is a side view illustrating the motor package including the motor controller according to one embodiment of the present invention in the state in which the cover of the motor controller is removed.

FIGS. 2 and 3 are a perspective view and a side view illustrating the motor package including the motor controller according to one embodiment of the present invention in a state in which a cover of the motor controller is removed. In addition, FIG. 4 is an exploded perspective view illustrating the motor package including the motor controller according to one embodiment of the present invention.

The motor controller 3 according to one embodiment of the present invention transmits power and a signal to a first electronic control unit (ECU) 31 and a second ECU 33 through one connector 32. Both of the first ECU 31 and the second ECU 33 control the motor 1 based on the received power and signal.

Here, in a case in which the motor 1 includes a dual-winding, it may be considered that each of the first ECU 31 and the second ECU 33 is connected to one winding to control half of an output of the motor 1.

Figure 4:
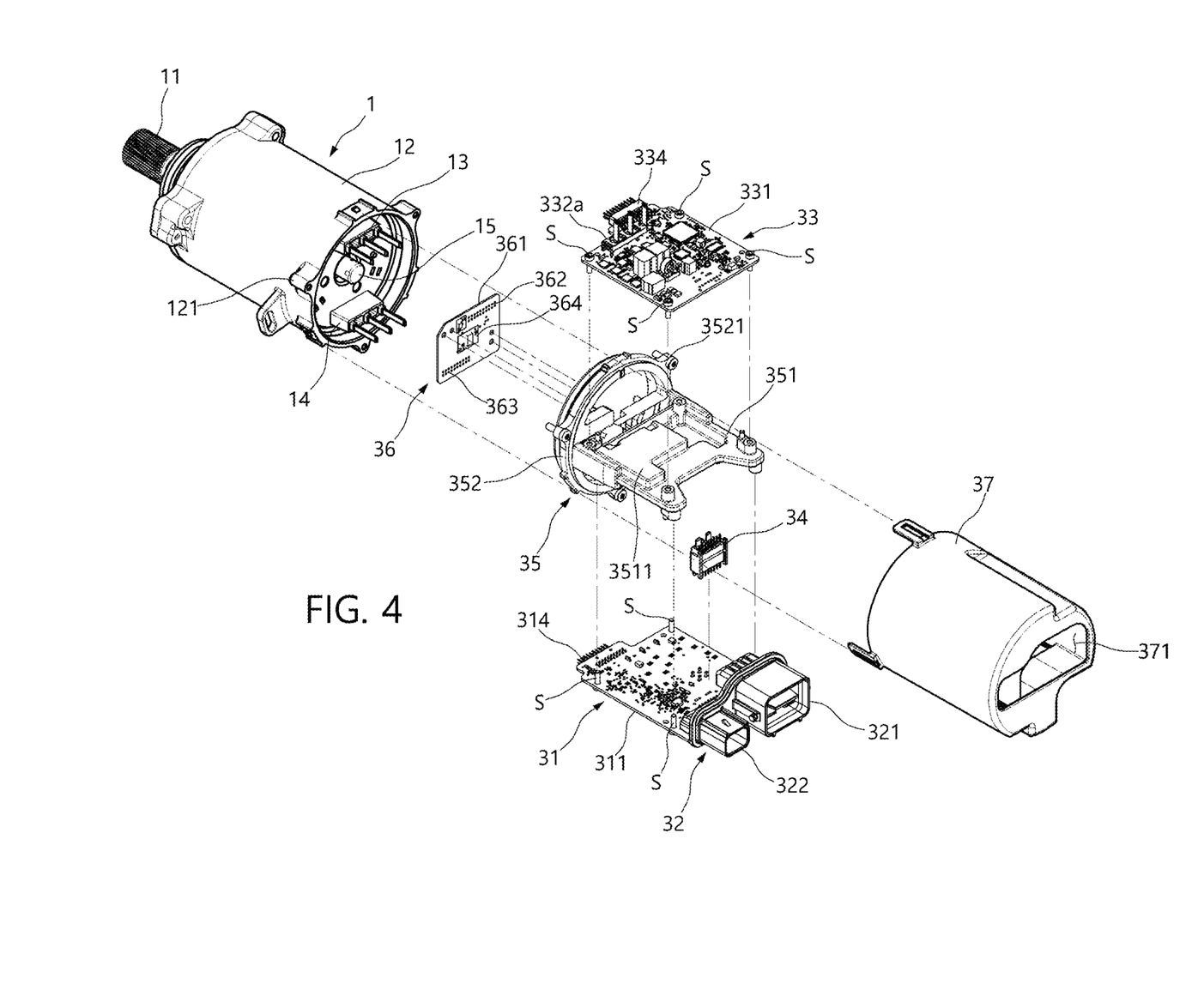
FIG. 4 is an exploded perspective view illustrating the motor package including the motor controller according to one embodiment of the present invention.

Referring to FIGS. 2 to 4, the motor controller 3 according to one embodiment of the present invention comprises the first ECU 31, the connector 32, the second ECU 33, a connection element 34, a heat radiation member 35, a motor position sensing unit 36, and a cover 37.

The first ECU 31 controls the motor 1. For example, the first ECU 31 may control the motor 1 according to power supplied from a power source (battery) of a vehicle and a signal transmitted from a main ECU of the vehicle.

As described above, in the case in which the motor 1 includes the dual-winding, the first ECU 31 may be connected to one winding of windings of the motor 1 to control half of the output of the motor 1.

The first ECU 31 may be disposed at the side, which is opposite to the output shaft 11, of the motor 1 along the axis A extending in the longitudinal direction of the motor. Other components of the motor controller 3 according to one embodiment of the present invention may be disposed on the basis of the first ECU 31, and accordingly, other components may also be disposed at the side, which is opposite to the output shaft 11, of the motor 1 along the axis A extending in the longitudinal direction of the motor.

Figure 5:
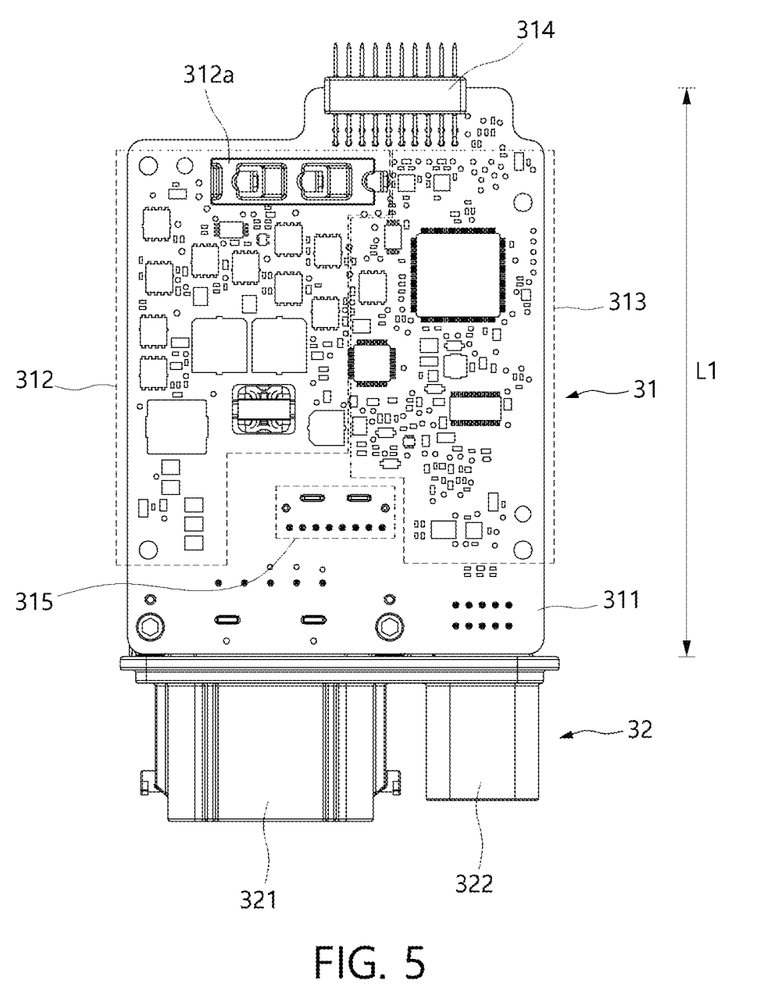
FIG. 5 is a plan view illustrating a first electronic control unit (ECU) and a connector of the motor controller according to one embodiment of the present invention.

Referring to FIG. 5, the first ECU 31 according to one embodiment of the present invention may comprise a first substrate 311, a first power circuit 312, a first control circuit 313, a first connection pin 314, and a first connection hole 315.

The first substrate 311 has a first length L1. The first substrate 311 may be formed as a printed circuit board (PCB). Various circuit elements to control the motor 1 are disposed on the first substrate 311. In addition, the connector 32 is connected to an end portion of one longitudinal side of the first substrate 311. In this case, the longitudinal direction is defined as a direction parallel to the axis A extending in the longitudinal direction of the motor.

The first power circuit 312 comprises one or more power elements and is disposed on the first substrate 311. The first power circuit 312 converts power supplied from the outside through the connector 32 to suitable power to drive the motor 1.

The first power circuit 312 comprises a first power terminal 312a connected to a first busbar 13 of the motor 1. In this case, the first busbar 13 may be a terminal connected to a first winding of the dual-winding of the motor 1.

The first power circuit 312 is a main heating portion of the first ECU 31. Accordingly, a main target of heat radiation through the heat radiation member 35 is the first power circuit 312 as will be described below.

The first control circuit 313 comprises one or more control elements and is disposed on the first substrate 311. The first control circuit 313 controls the first power circuit 312 and the like based on a signal transmitted from the outside through the connector 32 and finally controls the motor 1.

The first control circuit 313 generates relatively less heat than the first power circuit 312. Accordingly, the first control circuit 313 may also not be in contact with the heat radiation member 35 as will be described below.

The first connection pin 314 connects the motor position sensing unit 36 and the first ECU 31. Specifically, motor position sensing information may be transmitted to the first substrate 311 from the motor position sensing unit 36 through the first connection pin 314. The transmitted motor position sensing information may be transmitted to the external main ECU through the connector 32.

The first connection hole 315 is formed in the first substrate 311 such that one end of the connection element 34 is inserted into the first connection hole 315. Since one end of the connection element 34 is coupled to the first connection hole 315, the first substrate 311 and the second substrate 331 may be connected in a circuit manner.

The connector 32 transmits power and a signal to the first ECU 31. In addition, the motor position sensing information may also be transmitted to the outside through the connector 32. In other words, the connector 32 connects the external main ECU and the power source to the first ECU 31.

According to one embodiment of the present invention, the connector 32 is coupled to the end portion of one longitudinal side of the first substrate 311. More specifically, in a state in which an end portion of the other longitudinal side of the first substrate 311 is disposed close to an end portion of the side, which is opposite to the output shaft 11, of the motor housing 12, the connector 32 may be connected to the end portion of one longitudinal side of the first substrate 311.

According to one embodiment of the present invention, the connector 32 includes a first connector 321 and a second connector 322. The first connector 321 transmits external power and a signal to the first ECU 31. In addition, the second connector 322 transmits motor position sensing information transmitted from the motor position sensing unit 36 to the outside.

The second ECU 33 controls the motor 1. For example, the second ECU 33 may control the motor 1 according to power supplied from the power source (battery) of the vehicle and a signal transmitted from the main ECU like the first ECU 31.

As described above, in the case in which the motor 1 includes the dual-winding, the second ECU 33 may be connected to another winding, which is not connected to the first ECU 31, of the windings of the motor 1, to control the half output of the motor 1.

Figure 6:
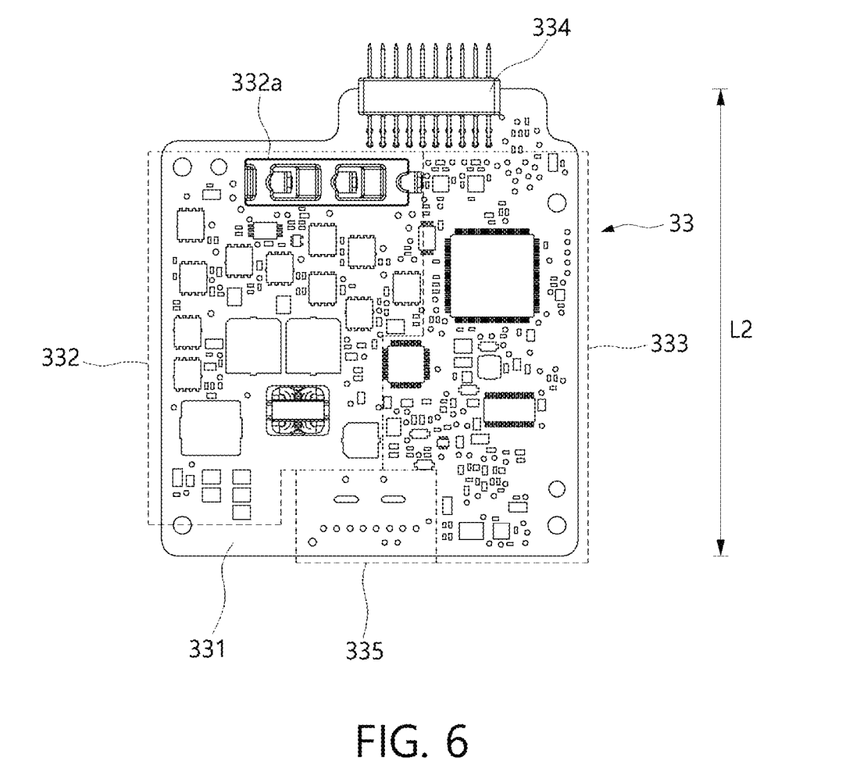
FIG. 6 is a plan view illustrating a second ECU of the motor controller according to one embodiment of the present invention.

Referring to FIG. 6, according to one embodiment of the present invention, the second ECU 33 may comprise a second substrate 331, a second power circuit 332, a second control circuit 333, a second connection pin 334, and a second connection hole 335.

The second substrate 331 has a second length L2. The second length L2 is shorter than the first length L1. Referring to FIGS. 3, 5, and 6, according to one embodiment of the present invention, the second length L2 may have a length such that one surface of the second substrate 331 overlaps one surface of the first substrate 311 in the longitudinal direction without interference with the connector 32.

Accordingly, in a state in which the connector 32 is connected to the end portion of one longitudinal side of the first substrate 311, the second substrate 331 may be disposed to face the first substrate 311 without interference with the connector 32. More specifically, in the state in which the connector 32 is connected to the end portion of one longitudinal side of the first substrate 311, an end portion of one longitudinal side of the second substrate 331 is disposed without interference with the connector 32, and the end portion of the other longitudinal side of the second substrate 331 may be disposed to be parallel to the end portion of the other longitudinal side of the first substrate 311. That is, the first substrate 311 and the second substrate 331 may be disposed to face each other at the side, which is opposite to the output shaft 11, of the motor 1 along the axis A extending in the longitudinal direction of the motor. Due to the above-described structure, space efficiency can be maximized.

The second substrate 331 may be formed as a PCB like the first substrate 331. In addition, various elements to control the motor 1 are disposed on the second substrate 331.

The second power circuit 332 comprises one or more power elements and is disposed on the second substrate 331. The second power circuit 332 receives power, which is supplied from the outside through the connector 32, from the first ECU 31 through the connection element 34 and converts the power to suitable power to drive the motor 1.

The second power circuit 332 comprises a first power terminal 332a connected to a second busbar 14 of the motor 1. In this case, the second busbar 14 may be a power terminal connected to a second winding of the dual-winding of the motor 1.

The second power circuit 332 is a main heating portion of the second ECU 33. Accordingly, a main target of heat radiation through the heat radiation member 35 is the second power circuit 332 as will be described below.

The second control circuit 333 comprises one or more control elements and is disposed on the second substrate 331. The second control circuit 333 receives a signal, which is transmitted from the outside through the connector 32, from the first ECU 31 through the connection element 34, controls the second power circuit 332 and the like, and finally controls the motor 1.

The second control circuit 333 generates relatively less heat than the second power circuit 332. Accordingly, the second control circuit 333 may also not be in direct contact with the heat radiation member 35 as will be described below.

The second connection pin 334 connects the motor position sensing unit 36 and the second ECU 33. Specifically, motor position sensing information may be transmitted to the second substrate 331 from the motor position sensing unit 36 through the second connection pin 334. The received motor position sensing information may be transmitted to the external main ECU through the connection element 34 and the connector 32.

The second connection hole 335 is formed in the second substrate 331 such that the other end of the connection element 34 is inserted into the second connection hole 335. Since the other end of the connection element 34 is coupled to the second connection hole 335, the second substrate 331 and the first substrate 311 may be connected in a circuit manner.

The connection element 34 is disposed to connect the first ECU 31 and the second ECU 33 in a circuit manner. The connection element 34 transmits power and a signal transmitted through the connector 32 to the second ECU 33 from the first ECU 31.

According to one embodiment of the present invention, the connection element 34 includes a busbar of which one end is connected to the first substrate 311 and the other end is connected to the second substrate 331. More specifically, one end of the connection element 34 may be inserted into the first connection hole 315, and the other end may be insertion-coupled to the second connection hole 335. Accordingly, the first substrate 311 and the second substrate 331 are connected in a circuit manner.

According to one embodiment of the present invention, a connector is not connected to the second ECU 33. Accordingly, the second ECU 33 may not be directly contended to the external main ECU and the power source. In this situation, the connection element 34 connects the first ECU 31 coupled to the connector 32 and the second ECU 33 in a circuit manner so that the second ECU 33 is indirectly connected to the external main ECU and the power source. Accordingly, two ECUs can also be simultaneously connected through a conventional wiring harness structure of a vehicle which may be connected to only one ECU.

The heat radiation member 35 is disposed along the axis A extending in the longitudinal direction of the motor 1 and radiates heat generated by the first ECU 31 and the second ECU 33. As shown in FIGS. 2 to 4, the heat radiation member 35 according to one embodiment of the present invention includes a first heat radiation portion 351 and a second heat radiation portion 352.

The first heat radiation portion 351 is a plate type member disposed between the first substrate 311 and the second substrate 331. The first heat radiation portion 351 is disposed between the first substrate 311 and the second substrate 331 and radiates heat generated by the first ECU 31 and the second ECU 33.

Figure 7:
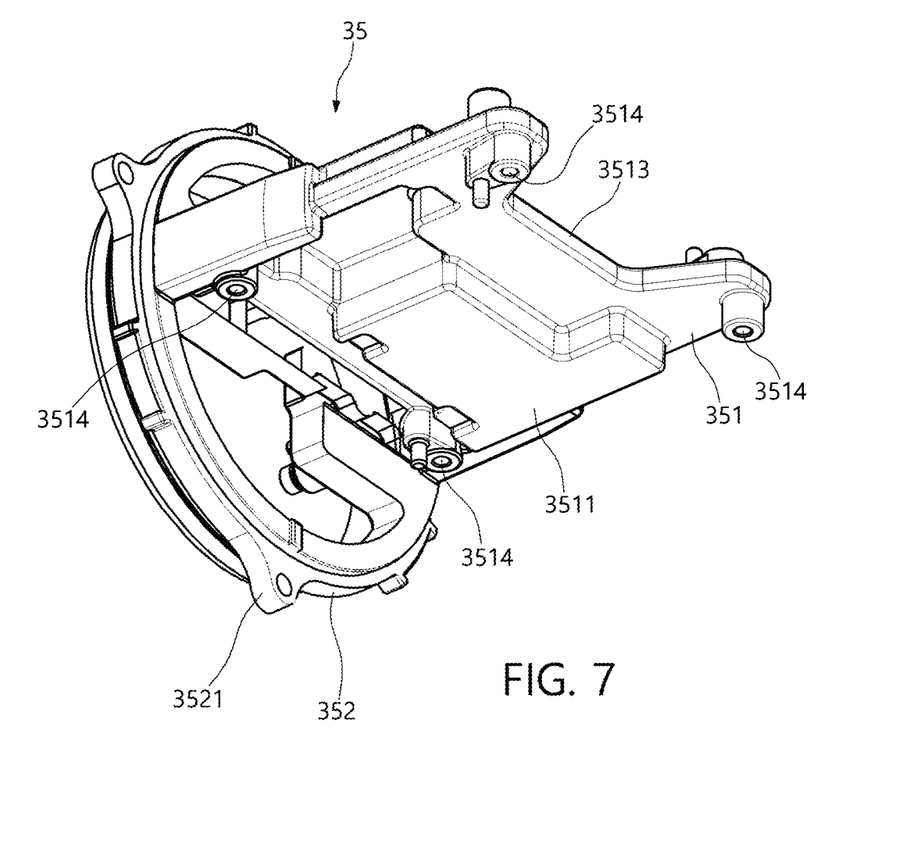
FIG. 7 is a plan perspective view illustrating a heat radiation member of the motor controller according to one embodiment of the present invention.
Figure 8:
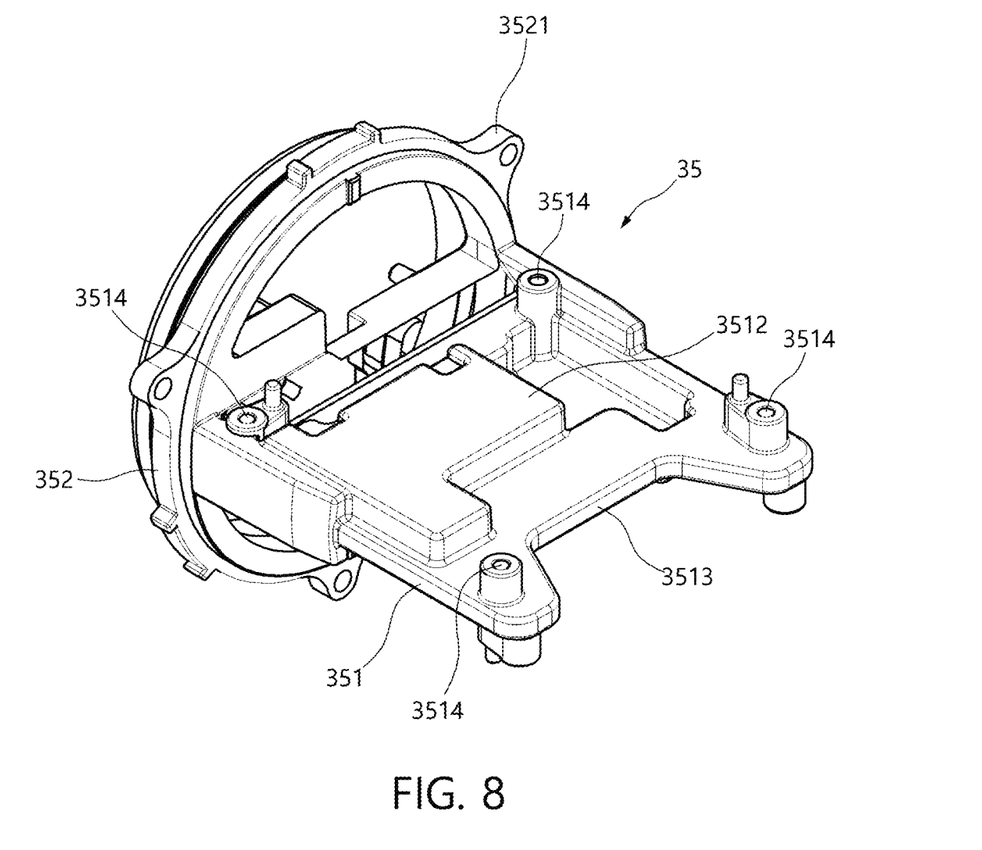
FIG. 8 is a bottom perspective view illustrating the heat radiation member of the motor controller according to one embodiment of the present invention.

Referring to FIGS. 7 and 8, the first heat radiation portion 351 according to one embodiment of the present invention comprises a first protrusion 3511 and a second protrusion 3512 formed to protrude from one side surface and the other side surface of the first heat radiation portion 351 in contact with the first substrate 311 and the second substrate 331 to be in contact with the first power circuit 312 and the second power circuit 332. The first protrusion 3511 and the second protrusion 3512 have positions and areas corresponding to the first power circuit 312 and the second power circuit 332 and have shapes to be in contact with the first substrate 311 and the second substrate 331.

As described above, the first ECU 31 and the second ECU 33 comprises the first power circuit 312 and the second power circuit 332 disposed on the first substrate 311 and the second substrate 331, and the first power circuit 312 and the second power circuit 332 are main heat sources of the first ECU 31 and the second ECU 33. The first protrusion 3511 and the second protrusion 3512 are in direct contact with the first power circuit 312 and the second power circuit 332 which generate relatively more heat so that heat radiation is smoothly performed.

According to one embodiment of the present invention, the first protrusion 3511 and the second protrusion 3512 are formed to have shapes such that at least a part of the first protrusion 3511 and at least a part of the second protrusion 3512 do not overlap when viewed from above. Due to such a structure, a heat radiation area is distributed so that heat radiation efficiency can be improved.

The first heat radiation portion 351 is disposed between the first substrate 311 and the second substrate 331, and the connection element 34 connecting the first substrate 311 and the second substrate 331 is disposed between the first substrate 311 and the second substrate 331. Accordingly, interference may occur between the first heat radiation portion 351 and the connection element 34. In order to prevent the interference, the first heat radiation portion 351 comprises a recessed portion 3513 formed to be recessed from an end portion of one side of the first heat radiation portion 351 toward the other side. The recessed portion 3513 is recessed from one side toward the other side so that the connection element 34 may be disposed without interference with the first heat radiation portion 351.

Meanwhile, according to one embodiment of the present invention, the first substrate 311 and the second substrate 331 are fixed to one surface and the other surface of the first heat radiation portion 351. Specifically, one or more screw holes 3514 are formed in each of one surface and the other surface of the first heat radiation portion 351, and the first substrate 311 and the second substrate 331 may be fixed to the first heat radiation portion 351 using screws S which pass through the first substrate 311 and the second substrate 331 and are coupled to the screw holes 3514.

The second heat radiation portion 352 is disposed to be in contact with an end portion of the side, which is opposite to the output shaft 11, of the motor 1 and is a heat radiation member connected to the first heat radiation portion 351. According to one embodiment of the present invention, the second heat radiation portion 352 is formed to have an annular shape. In addition, the first heat radiation portion 351 is connected to an inner circumferential surface of the second heat radiation portion 352. Accordingly, heat transmitted through the first heat radiation portion 351 may be discharged to the outside through the second heat radiation portion 352.

According to one embodiment of the present invention, the second heat radiation portion 352 is coupled to the end portion of the side, which is opposite to the output shaft 11, of both sides of the motor housing 12. More specifically, one or more screw holes 121 are provided in the end portion of the motor housing 12 formed to have a cylindrical shape, and the second heat radiation portion 352 includes screw holes 3521 at positions corresponding to the screw holes 121. Since screws are insertion-coupled to the screw holes 3521 of the second heat radiation portion 352 and the screw holes 121 of the motor housing 12, the second heat radiation portion 352 may be coupled to the motor 1.

Meanwhile, a sealing member may be disposed between the second heat radiation portion 352 and the motor housing 12 to secure air tightness. For example, the sealing member may be an O-ring.

According to one embodiment of the present invention, the first heat radiation portion 351 and the second heat radiation portion 352 may be integrally formed. In addition, a material of the first heat radiation portion 351 and the second heat radiation portion 352 may be an aluminum alloy material having advantages in mechanical properties and thermal conductivity.

The motor position sensing unit 36 is disposed to be in contact with the end portion of the side, which is opposite to the output shaft 11, of the motor 1 and provides motor position sensing information to the first ECU 31 and the second ECU 33.

According to one embodiment of the present invention, the motor position sensing unit 36 senses a motor position using a sensor magnet 15 disposed on one end portion of a rotating shaft of the motor 1. Motor position sensing information may be transmitted to the external main ECU through the first ECU 31 or second ECU 33 and the second connector 322.

Figure 9:
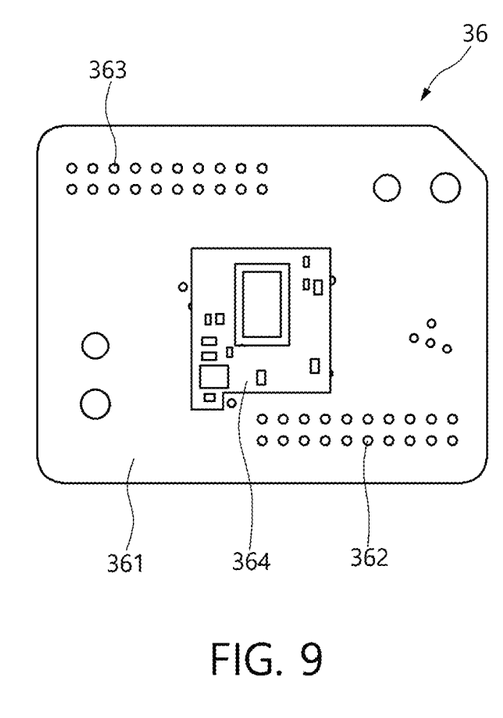
FIG. 9 is a view illustrating one surface of a motor position sensing unit of the motor controller according to one embodiment of the present invention.

Referring to FIG. 9, the motor position sensing unit 36 comprises a connection substrate 361, a first terminal 362, a second terminal 363, and a motor position sensor 364.

The connection substrate 361 is disposed to be in contact with the end portion of the side, which is opposite to the output shaft 11, of the motor 1. The connection substrate 361 may be formed as a PCB like the first substrate 311 and the second substrate 331.

The first terminal 362 and the second terminal 363 are provided on the connection substrate 361 to be connected to the first ECU 31 and the second ECU 33. According to one embodiment of the present invention, the first terminal 362 and the second terminal 363 are formed on the connection substrate 361 to have pin insertion hole shapes. The first connection pin 314 and the second connection pin 334 are inserted into the first terminal 362 and the second terminal 363 so that the first ECU 31 and the second ECU 33 are connected to the motor position sensing unit 36.

Meanwhile, according to one embodiment of the present invention, the first terminal 362 and the second terminal 363 may have identifications (IDs) which are identified in hardware. For example, any one of the first terminal 362 and the second terminal 363 may be connected to a pull-up resistor, and the other one may be connected to a pull-down resistor. Such a difference may be shown from the connection substrate 361 to be visually identifiable.

When the first terminal 362 and the second terminal 363 are distinguished in hardware, the first ECU 31 and the second ECU 33 may be distinguished according to where each of the first ECU 31 and the second ECU 33 is connected to any one of the first terminal 362 and the second terminal 363. Accordingly, there is an advantage of preventing occurrence of defects in a mass production process when compared to a case in which the first ECU 31 and the second ECU 33 are distinguished in software.

The motor position sensor 364 is coupled to the connection substrate 361 and senses position information of the motor. According to one embodiment of the present invention, the motor position sensor 364 may be disposed to be coaxial with and spaced apart from the sensor magnet 15 disposed at one end portion of the rotating shaft of the motor 1.

The cover 37 protects the first ECU 31, the connector 32, the second ECU 33, the connection element 34, the heat radiation member 35, and the motor position sensing unit 36 from external foreign materials and the like. According to one embodiment of the present invention, the cover 37 is formed to have a cylindrical shape which is connected to the motor housing 12, and the connector 32 may pass through an end portion of one longitudinal side of the cover 37.

According to one embodiment of the present invention, since two ECUs are connected through one connection element, power and control signals can be simultaneously transmitted to the two ECUs through one connector.

According to one embodiment of the present invention, since substrates of two ECUs have different lengths such that the substrates are disposed without interference with a connector, space efficiency can be secured and a size of a package can be minimized.

While one embodiment of the present invention has been described above, the spirit of the present invention is not limited to the embodiment proposed in this specification, and it will be understood by those skilled in the art that other embodiments may be easily suggested by adding, changing, and deleting components, and the other embodiments will fall within the spiritual range of the present invention.

What is claimed is:

1. A motor controller comprising:
   a first electronic control unit (ECU) which comprises a first substrate having a first length and controls a motor;
   a connector which is connected to one end portion of one longitudinal side of the first substrate to transmit power and a signal to the first ECU;
   a second ECU which comprises a second substrate having a second length in a longitudinal direction of the motor shorter than the first length of the first substrate in the longitudinal direction of the motor so that at least a part of the connector connected to the first substrate is disposed at a space formed by the shorter second length of the second substrate in the longitudinal direction of the motor than the first length of the first substrate in the longitudinal direction of the motor, wherein the second ECU includes one surface facing one surface of the first substrate and the second substrate is configured to control the motor; and
   a connection element which is disposed to connect the first ECU and the second ECU in a circuit manner and transmits the power and the signal to the second ECU.

2. The motor controller of claim 1, wherein the second length has a length such that the one surface of the second substrate is disposed to overlap the one surface of the first substrate in the longitudinal direction without interference with the connector.

3. The motor controller of claim 1, wherein the connection element includes a busbar of which one end portion is connected to the first substrate and the other portion is connected to the second substrate.

4. The motor controller of claim 1, wherein the first ECU is disposed at a side, which is opposite to an output shaft, of the motor along an axis extending in the longitudinal direction of the motor.

5. The motor controller of claim 4, further comprising a heat radiation member disposed along the axis extending in the longitudinal direction of the motor and configured to radiate heat generated by the first ECU and the second ECU.

6. The motor controller of claim 5, wherein the heat radiation member comprises a first heat radiation portion disposed between the first substrate and the second substrate and having a plate shape.

7. The motor controller of claim 6, wherein the first heat radiation portion comprises a recessed portion formed to be recessed from an end portion of one side of the first heat radiation portion toward the other side to prevent interference with the connection element.

8. The motor controller of claim 4, further comprising a motor position sensing unit disposed to be in contact with an end portion of the side, which is opposite to the output shaft, of the motor and configured to provide motor position sensing information to the first ECU and the second ECU.

9. The motor controller of claim 8, wherein the motor position sensing unit comprises:
   a connection substrate disposed to be in contact with the end portion of the side, which is opposite to the output shaft, of the motor;
   a first terminal provided on the connection substrate to be connected to the first ECU;
   a second terminal provided on the connection substrate to be connected to the second ECU; and
   a motor position sensor coupled to the connection substrate.

10. The motor controller of claim 9, wherein each of the first terminal and the second terminal has an identification (ID) which is identified in hardware.

11. The motor controller of claim 1, wherein the second substrate, facing the first substrate, and the at least a part of the connector, disposed at the space formed by the shorter second length of the second substrate in the longitudinal direction of the motor than the first length of the first substrate in the longitudinal direction of the motor, are disposed parallel to the first substrate.

12. The motor controller of claim 1, wherein the first substrate of the first ECU and the second substrate of the second ECU having a shorter length than the first substrate of the first ECU, are disposed along the longitudinal direction of the motor.

13. The motor controller of claim 1, wherein the space, at which the at least a part of the connector connected to the first substrate disposed, is formed between one end portion of the second substrate and a cover accommodating the first ECU and the second ECU.

14. A motor controller comprising:
a first electronic control unit (ECU) which comprises a first substrate having a first length and controls a motor;
a connector which is connected to one end portion of one longitudinal side of the first substrate to transmit power and a signal to the first ECU;
a second ECU which comprises a second substrate having a second length shorter than the first length and including one surface facing one surface of the first substrate and controls the motor;
a connection element which is disposed to connect the first ECU and the second ECU in a circuit manner and transmits the power and the signal to the second ECU; and
a heat radiation member configured to radiate heat generated by the first ECU and the second ECU, the heat radiation member comprising a first heat radiation portion disposed between the first substrate and the second substrate,
wherein:
the first ECU and the second ECU comprise a first power circuit and a second power circuit disposed on the first substrate and the second substrate; and
the first heat radiation portion comprises a first protrusion and a second protrusion formed to protrude from one side surface and the other side surface of the first heat radiation portion in contact with the first substrate and the second substrate so as to be in contact with the first power circuit and the second power circuit.

15. The motor controller of claim 14, wherein at least a part of the first protrusion does not overlap the second protrusion when viewed from above.

16. A motor controller comprising:
a first electronic control unit (ECU) which comprises a first substrate having a first length and controls a motor;
a connector which is connected to one end portion of one longitudinal side of the first substrate to transmit power and a signal to the first ECU;
a second ECU which comprises a second substrate having a second length shorter than the first length and including one surface facing one surface of the first substrate and controls the motor;
a connection element which is disposed to connect the first ECU and the second ECU in a circuit manner and transmits the power and the signal to the second ECU; and
a heat radiation member configured to radiate heat generated by the first ECU and the second ECU, the heat radiation member comprising:
a first heat radiation portion disposed between the first substrate and the second substrate, and
a second heat radiation portion disposed to be in contact with an end portion of the side, which is opposite to an output shaft, of the motor and connected to the first heat radiation portion.

17. The motor controller of claim 16, wherein the second heat radiation portion is formed to have an annular shape.

* * * * *